United States Patent
Matsumoto et al.

(10) Patent No.: US 11,460,497 B2
(45) Date of Patent: Oct. 4, 2022

(54) DEVICE ANALYSIS APPARATUS AND DEVICE ANALYSIS METHOD

(71) Applicant: HAMAMATSU PHOTONICS K.K., Hamamatsu (JP)

(72) Inventors: Toru Matsumoto, Hamamatsu (JP); Koichi Endo, Tokyo (JP); Tomonori Nakamura, Hamamatsu (JP); Kazushige Koshikawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 65 days.

(21) Appl. No.: 16/624,008

(22) PCT Filed: Apr. 18, 2018

(86) PCT No.: PCT/JP2018/016039
§ 371 (c)(1),
(2) Date: Dec. 18, 2019

(87) PCT Pub. No.: WO2019/003599
PCT Pub. Date: Jan. 3, 2019

(65) Prior Publication Data
US 2020/0110127 A1    Apr. 9, 2020

(30) Foreign Application Priority Data
Jun. 29, 2017   (JP) .............................. JP2017-127304

(51) Int. Cl.
*G01R 31/26*   (2020.01)
(52) U.S. Cl.
CPC .............................. *G01R 31/2608* (2013.01)

(58) Field of Classification Search
CPC ............... G01R 31/26; G01R 31/2608; G01R 31/2621; G01R 31/2656
See application file for complete search history.

(56) References Cited

U.S. PATENT DOCUMENTS

| 660,591 A | 10/1900 | Russell |
|---|---|---|
| 4,680,635 A | 7/1987 | Khurana |

(Continued)

FOREIGN PATENT DOCUMENTS

| CN | 105807197 A | 7/2016 |
|---|---|---|
| DE | 102013103014 A1 | 10/2013 |

(Continued)

OTHER PUBLICATIONS

Tomoko Matsudai et al., "Direct photo emission monitoring for high power IGBT during avalanche operation", IEEE International Reliability Physics Symposium (IRPS), Apr. 17, 2016, XP03296982.

(Continued)

*Primary Examiner* — Son T Le
(74) *Attorney, Agent, or Firm* — Faegre Drinker Biddle & Reath LLP (57) ABSTRACT

A device analysis apparatus is a device analysis apparatus for determining a quality of a power semiconductor device, including an application unit that applies a voltage signal to the power semiconductor device, a light detection unit that detects light from the power semiconductor device at a plurality of detection positions and outputs detection signals based on detection results, and a determination unit that determines the quality of the power semiconductor device based on temporal changes of the detection signals.

17 Claims, 9 Drawing Sheets

(56) References Cited

U.S. PATENT DOCUMENTS

| | | | | |
|---|---|---|---|---|
| 4,906,922 | A | * | 3/1990 | Takahashi ............ G01R 15/242 324/73.1 |
| 6,111,271 | A | * | 8/2000 | Snyman ................. H01L 33/34 257/E33.045 |
| 6,346,821 | B1 | | 2/2002 | Baumgart |
| 6,605,951 | B1 | | 8/2003 | Cowan |
| 2003/0098692 | A1 | | 5/2003 | Cotton et al. |
| 2007/0113630 | A1 | * | 5/2007 | Matsumoto ............ G01Q 20/02 73/105 |
| 2015/0024520 | A1 | | 1/2015 | Tanaka et al. |
| 2015/0377953 | A1 | * | 12/2015 | Nakamura ......... G01R 31/2656 324/97 |
| 2017/0307682 | A1 | * | 10/2017 | Nakamura ............ G01J 5/0007 |

FOREIGN PATENT DOCUMENTS

| | | | |
|---|---|---|---|
| JP | H05-315425 A | | 11/1993 |
| JP | H06-194407 A | | 7/1994 |
| JP | H07-66264 A | | 3/1995 |
| JP | H10-150086 A | | 6/1998 |
| JP | H11230972 A | * | 8/1999 |
| JP | 2005-510737 A | | 4/2005 |
| JP | 2007-318031 A | | 12/2007 |
| JP | 2010-271307 A | | 12/2010 |
| JP | 2013-120075 A | | 6/2013 |
| JP | 2013-232555 A | | 11/2013 |
| JP | 2014-197684 A | | 10/2014 |
| JP | 2014-236124 A | | 12/2014 |
| KR | 1020080091290 A | | 10/2008 |
| KR | 1020130042225 A | | 4/2013 |
| TW | 201538965 A | | 10/2015 |
| WO | WO-03/046593 A1 | | 6/2003 |
| WO | WO 2014/129377 A1 | | 8/2014 |
| WO | WO 2016/002003 A1 | | 1/2016 |
| WO | WO-2016056109 A1 | * | 4/2016 ............ G01J 5/0003 |

OTHER PUBLICATIONS

Matsudai, Tomoko et al., "Direct Photo Emission Monitoring for High Power IGBT during Avalanche Operation," The 36th NANO Testing Symposium, 2016, pp. 9-11.

International Preliminary Report on Patentability dated Jan. 9, 2020 for PCT/JP2018/016039.

* cited by examiner

DEVICE ANALYSIS APPARATUS AND DEVICE ANALYSIS METHOD

TECHNICAL FIELD

The present disclosure relates to a device analysis apparatus and a device analysis method.

BACKGROUND ART

In a power semiconductor device used for power conversion, etc., improvement in reliability under large current and high withstand voltage driving has been a problem. Operation analysis before a breakdown of an element is important in improving reliability of the power semiconductor device. Examples of a technology for carrying out operation analysis of such a power semiconductor device include an avalanche light emission analysis method of an IGBT described in Non Patent Literature 1.

The insulated gate bipolar transistor (IGBT) has a structure in which a p-type layer is added to a drain (n-type) of a metal-oxide-semiconductor field-effect transistor (MOSFET) which is one of field effect transistors, and particularly corresponds to an element widely used as an element for power switching. In Non Patent Literature 1, attention is paid to current non-uniformity resulting from an avalanche phenomenon and an element breakdown due to current concentration, and light emission associated with the avalanche phenomenon is observed on a side surface of the power semiconductor device using a streak camera.

CITATION LIST

Non Patent Literature

Non Patent Literature 1: Tomoko Matsudai et.al., "Direct Photo Emission Monitoring for HighPower IGBT during Avalanche Operation" The 36th NANO Testing Symposium, 9-11 Nov. 2016

SUMMARY OF INVENTION

Technical Problem

In the method of Non Patent Literature 1 described above, light emission from a side surface of a chip of the power semiconductor device is observed using the streak camera through a slit. For this reason, there is a restriction that observation of light emission accompanying the avalanche phenomenon is limited to one-dimensional change. Therefore, to accurately determine the quality of the power semiconductor device by operation analysis before breakdown of the element, it is necessary to acquire more information indicating the behavior of the element. In addition, to identify a two-dimensional position of the power semiconductor device in the chip, it is necessary to estimate the position from data detected using a plurality of streak cameras.

The present disclosure has been made to solve the above-mentioned problem, and an object of the present disclosure is to provide a device analysis apparatus and a device analysis method capable of accurately determining the quality of a power semiconductor device by operation analysis before breakdown of an element.

Solution to Problem

A device analysis apparatus according to an aspect of the present disclosure is a device analysis apparatus for determining a quality of a power semiconductor device, including an application unit that applies a voltage signal to the power semiconductor device, a light detection unit that detects light from the power semiconductor device at a plurality of detection positions and outputs detection signals based on detection results, and a determination unit that determines the quality of the power semiconductor device based on temporal changes of the detection signals.

In the device analysis apparatus, the voltage signal is applied to the power semiconductor device. Further, light from the power semiconductor device is detected at the plurality of detection positions, and the quality of the power semiconductor device is determined based on temporal changes of the detection signals. In general, an internal structure is uniform in the power semiconductor device. For this reason, while the temporal changes of the detection signals at the plurality of detection positions are uniform in a normal power semiconductor device, variations occur in the temporal changes of a plurality of detection signals in an abnormal power semiconductor device. Therefore, with reference to the temporal changes of the detection signals at the plurality of detection positions, the quality of the power semiconductor device can be accurately determined by operation analysis before breakdown of an element.

In addition, the device analysis apparatus may further include a comparison unit that compares the temporal changes of the detection signals with a preset threshold value, and the determination unit may determine the quality of the power semiconductor device based on a comparison result in the comparison unit. In this case, it is possible to quantitatively compare the temporal changes of the plurality of detection signals. Therefore, it is possible to more accurately determine the quality of the power semiconductor device.

In addition, the device analysis apparatus may further include a comparison unit that compares the temporal changes of the detection signals with each other, and the determination unit may determine the quality of the power semiconductor device based on a comparison result in the comparison unit. In this case, it is possible to quantitatively compare the temporal changes of the plurality of detection signals. Therefore, it is possible to more accurately determine the quality of the power semiconductor device.

In addition, the light detection unit may detect light from the power semiconductor device at a plurality of detection positions including a peripheral portion of the power semiconductor device. The peripheral portion of the power semiconductor device is a part in which a guard ring corresponding to a ground potential is disposed and an electric field is easily concentrated. For this reason, by performing detection in the peripheral portion of the power semiconductor device, it is possible to detect light having high intensity, and to easily detect light by application of a voltage signal.

In addition, the light detection unit may simultaneously detect light from the power semiconductor device at the plurality of detection positions. In this case, light detection at the plurality of detection positions can be rapidly performed.

In addition, the light detection unit may individually detect light from the power semiconductor device at the plurality of detection positions. In this case, a configuration of the light detection unit can be simplified.

In addition, the application unit may apply a voltage signal causing avalanche breakdown to the power semiconductor device. In this case, in the power semiconductor device, it is possible to cause light emission due to the avalanche breakdown.

In addition, the light detection unit may detect light emission occurring in the power semiconductor device due to the avalanche breakdown. By detection of the light emission due to the avalanche breakdown, a difference between the temporal changes of the detection signals due to the quality of the power semiconductor device becomes remarkable, and the quality of the power semiconductor device can be more accurately determined.

In addition, a time resolution of the light detection unit may be 1 μs or less. In this case, it is possible to accurately comprehend the temporal changes of the detection signals.

In addition, a device analysis method according to an aspect of the present disclosure is a device analysis method of determining a quality of a power semiconductor device, including an application step of applying a voltage signal to the power semiconductor device, a light detection step of detecting light from the power semiconductor device at a plurality of detection positions and outputting detection signals based on detection results, and a determination step of determining the quality of the power semiconductor device based on temporal changes of the detection signals.

In the device analysis method, the voltage signal is applied to the power semiconductor device. Further, light from the power semiconductor device is detected at the plurality of detection positions, and the quality of the power semiconductor device is determined based on temporal changes of the detection signals. In general, an internal structure is uniform in the power semiconductor device. For this reason, while the temporal changes of the detection signals at the plurality of detection positions are uniform in a normal power semiconductor device, variations occur in the temporal changes of the plurality of detection signals in an abnormal power semiconductor device. Therefore, with reference to the temporal changes of the detection signals at the plurality of detection positions, the quality of the power semiconductor device can be accurately determined by operation analysis before breakdown of an element.

In addition, the device analysis method may further include a comparison step of comparing the temporal changes of the detection signals with a preset threshold value, and the quality of the power semiconductor device may be determined in the determination step based on a comparison result in the comparison step. In this case, it is possible to quantitatively compare the temporal changes of the plurality of detection signals. Therefore, it is possible to more accurately determine the quality of the power semiconductor device.

In addition, the device analysis method may further include a comparison step of comparing the temporal changes of the detection signals with each other, and the quality of the power semiconductor device may be determined in the determination step based on a comparison result in the comparison step. In this case, it is possible to quantitatively compare the temporal changes of the plurality of detection signals. Therefore, it is possible to more accurately determine the quality of the power semiconductor device.

In addition, light from the power semiconductor device may be detected at a plurality of detection positions including a peripheral portion of the power semiconductor device in the light detection step. The peripheral portion of the power semiconductor device is a part in which a guard ring corresponding to a ground potential is disposed and an electric field is easily concentrated. For this reason, by performing detection in the peripheral portion of the power semiconductor device, it is possible to detect light having high intensity, and to easily detect light by application of a voltage signal.

In addition, light from the power semiconductor device may be simultaneously detected at the plurality of detection positions in the light detection step. In this case, light detection at the plurality of detection positions can be rapidly performed.

In addition, light from the power semiconductor device may be individually detected at the plurality of detection positions in the light detection step. In this case, a configuration of a light detection unit can be simplified.

In addition, a voltage signal causing avalanche breakdown may be applied to the power semiconductor device in the application step. In this case, in the power semiconductor device, it is possible to cause light emission due to the avalanche breakdown.

In addition, light emission occurring in the power semiconductor device due to the avalanche breakdown may be detected in the light detection step. By detection of the light emission due to the avalanche breakdown, a difference between the temporal changes of the detection signals due to the quality of the power semiconductor device becomes remarkable, and the quality of the power semiconductor device can be more accurately determined.

In addition, the light may be detected at a time resolution of 1μs or less in the light detection step. In this case, it is possible to accurately comprehend the temporal changes of the detection signals.

Advantageous Effects of Invention

According to the present disclosure it is possible to accurately determine the quality of a power semiconductor device by operation analysis before breakdown of an element.

DESCRIPTION OF EMBODIMENTS

Hereinafter, a preferred embodiment of a device analysis apparatus and a device analysis method according to an aspect of the present disclosure will be described in detail with reference to drawings.

Figure 1:
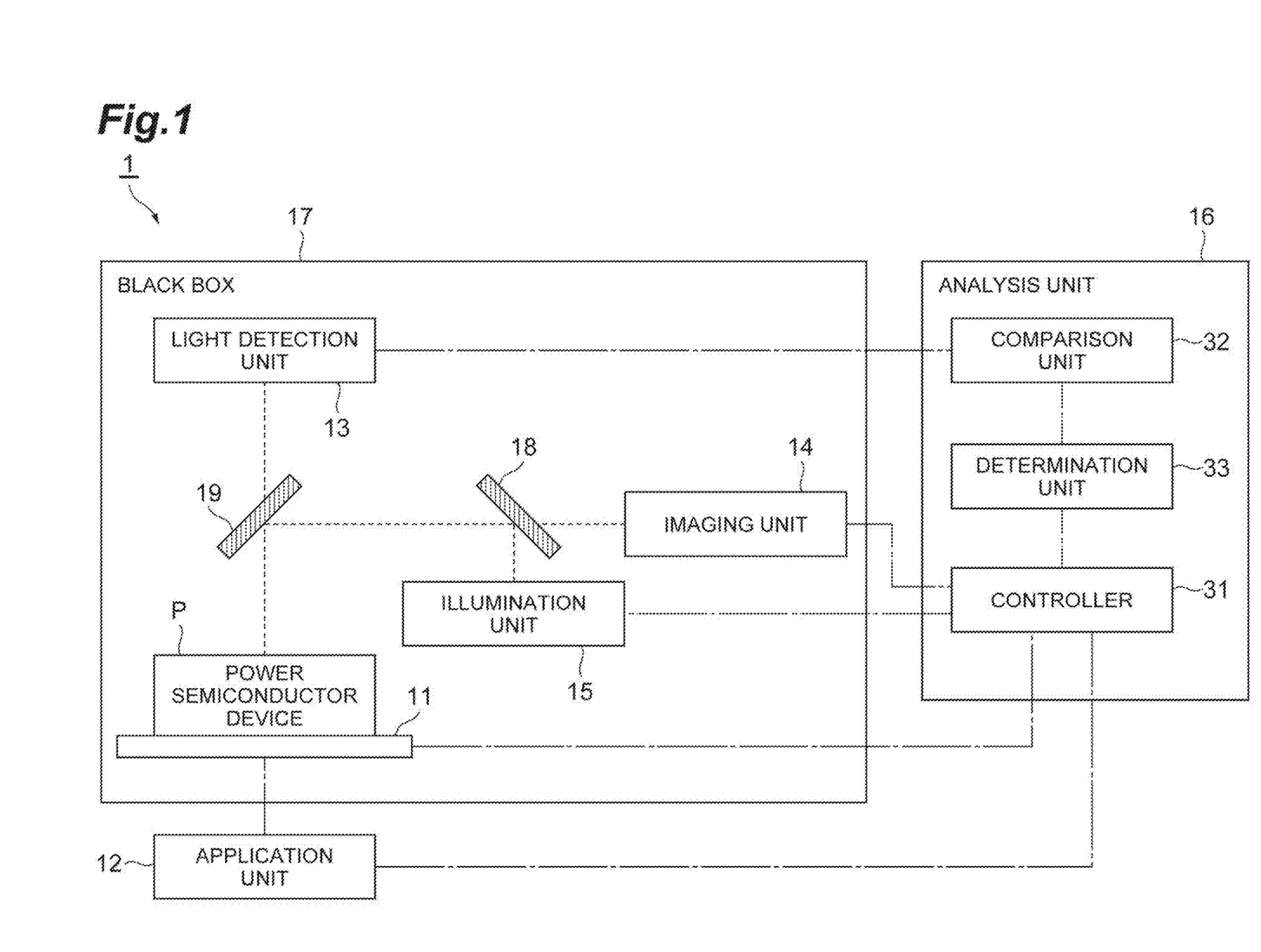
FIG. 1 is a block diagram illustrating an embodiment of a device analysis apparatus.

FIG. 1 is a block diagram illustrating an embodiment of the device analysis apparatus. The device analysis apparatus 1 illustrated in FIG. 1 is an apparatus that determines the quality of a power semiconductor device P by operation analysis before breakdown of an element. Examples of the power semiconductor device p corresponding to an object to be analyzed include an insulated gate bipolar transistor (IGBT). The IGBT has a structure in which a p-type layer is added to a drain (n-type) of a metal-oxide-semiconductor field-effect transistor (MOSFET) which is one of field effect transistors, and particularly corresponds to an element widely used as an element for power switching. The power semiconductor device P may correspond to an injection enhanced gate transistor (IEGT), a power MOSFET, etc.

Figure 2:
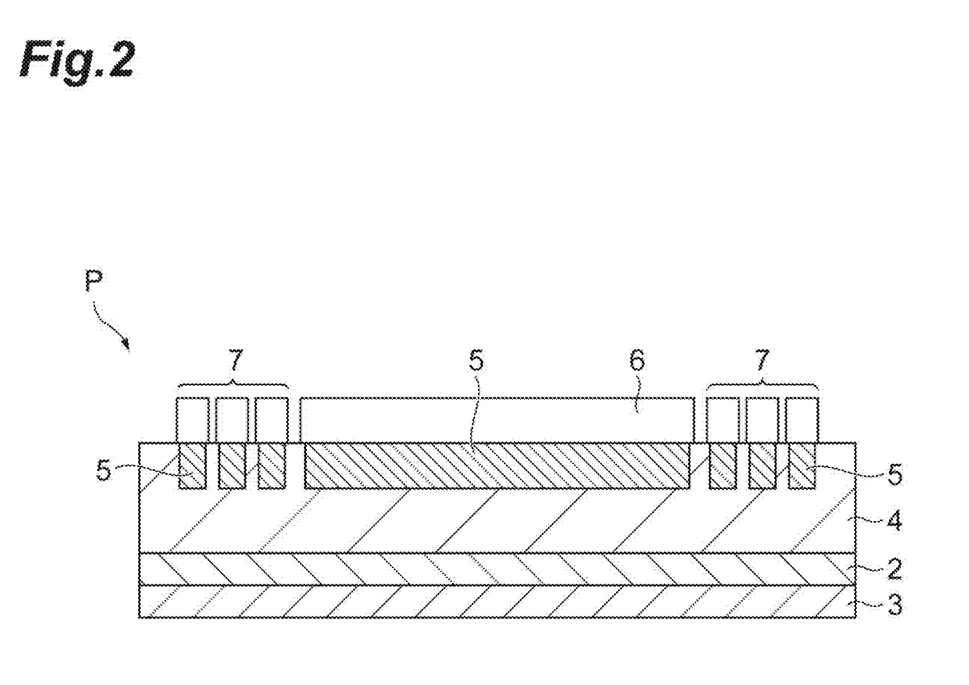
FIG. 2 is a schematic view illustrating a configuration example of a power semiconductor device corresponding to an object to be analyzed.

For example, as illustrated in FIG. 2, the power semiconductor device P includes a P collector ($P^+$ substrate) 2. A collector electrode 3 is formed on one surface side of the P collector 2. In addition, an N base 4, an IGBT cell 5, an emitter electrode 6, and a guard ring 7 are formed on the other surface side of the P collector 2. The IGBT cell 5 is a portion provided with a gate structure. Further, the guard ring 7 is a portion corresponding to a ground potential, and is annularly provided to surround the emitter electrode 6 in plan view (see FIG. 5).

As illustrated in FIG. 1, the device analysis apparatus 1 includes a drive stage 11, an application unit 12, a light detection unit 13, an imaging unit 14, an illumination unit 15, and an analysis unit 16. The drive stage 11, the light detection unit 13, the imaging unit 14, and the illumination unit 15 are installed in a black box 17.

The drive stage 11 moves the power semiconductor device P corresponding to an object to be analyzed. The drive stage 11 has a mounting surface on which the power semiconductor device P is mounted. Based on the control from the analysis unit 16, the drive stage 11 is driven in an in-plane direction of the mounting surface such that a detection position of the power semiconductor device P coincides with a position of a probe 22 (see FIG. 4) of the light detection unit 13.

The application unit 12 applies a voltage signal to the power semiconductor device P. For example, a pulse generator can be used as the application unit 12. The application unit 12 is electrically connected to the power semiconductor device P, and applies a voltage signal causing avalanche breakdown to the power semiconductor device P. The application unit 12 generates a trigger signal indicating an application timing of the voltage signal to the power semiconductor device, and outputs the trigger signal to the analysis unit 16.

FIG. 3(a) is an equivalent circuit diagram of the power semiconductor device at the time of analysis execution. In addition, FIG. 3(b) is a diagram illustrating a relationship between a voltage signal and a current waveform. In the figure, Vg indicates a gate voltage, Vc indicates a voltage of a transistor, and Ic indicates an inductor current. In an example of the figure, under an unclamped inductive switching (UIS) condition, a positive voltage signal modulated in a rectangular pulse shape is repeatedly applied as a gate voltage to the power semiconductor device P. At a rise timing of Vg, the transistor is turned on, Vc becomes a negative value, and Ic gradually increases as a coil inductance decreases.

In addition, at a fall timing of Vg, the transistor is turned off, Vc becomes a positive value, and Ic gradually decreases as the coil inductance increases. In a case in which a voltage signal causing avalanche breakdown as Vg is applied to the power semiconductor device P, a period f in which Ic gradually decreases corresponds to an avalanche breakdown period. In the period f, light emission resulting from avalanche breakdown occurs in the power semiconductor device P. The light emission resulting from the avalanche breakdown first occurs at the highest intensity in a curved portion (see FIG. 5) of the guard ring 7 annularly provided to surround the emitter electrode 6. Thereafter, the light emission moves from the curved portion to a straight portion along the guard ring 7.

The light detection unit 13 detects light from the power semiconductor device P at a plurality of positions, and outputs detection signals based on detection results. The light from the power semiconductor device P may include light reflected or scattered by the power semiconductor device P in addition to light emission generated in the power semiconductor device P. For example, the light detection unit 13 includes a time-resolved photodetector having a time resolution of 1 μs or less. When light emission resulting from the avalanche breakdown is detected, it is preferable that the time resolution of the light detection unit 13 is 100 ns to 1 μs and a wavelength range is 200 nm to 2,000 nm. Examples of such a time-resolved photodetector include a two-dimensional detector such as a micro channel plate (MCP), a single-photon avalanche diode (SPAR), and a multichannel photomultiplier (MCH-PMT), etc.

Figure 4:
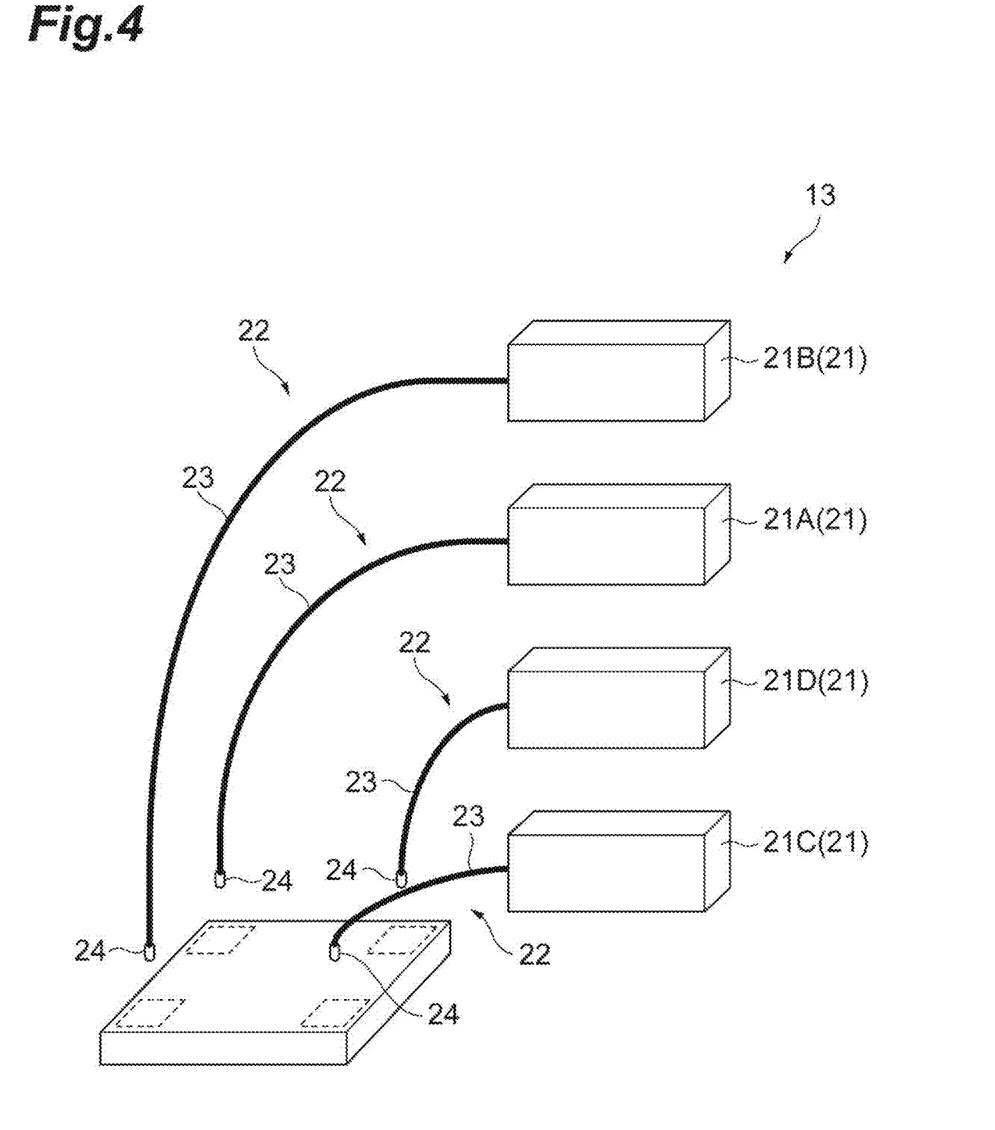
FIG. 4 is a schematic view illustrating an example of a configuration of a light detection unit.

In addition, to simultaneously detect light from the power semiconductor device P at a plurality of detection positions, as illustrated in FIG. 4, the light detection unit 13 may include a point photodetector 21 to which the probe 22 is connected. As the point photodetector 21, for example, it is possible to use a photomultiplier tube or a superconducting single photon detector (SSPD). The probe 22 is configured by providing an optical system 24 such as a lens at a distal end of an optical fiber 23 optically connected to the point photodetector 21.

Figure 5:
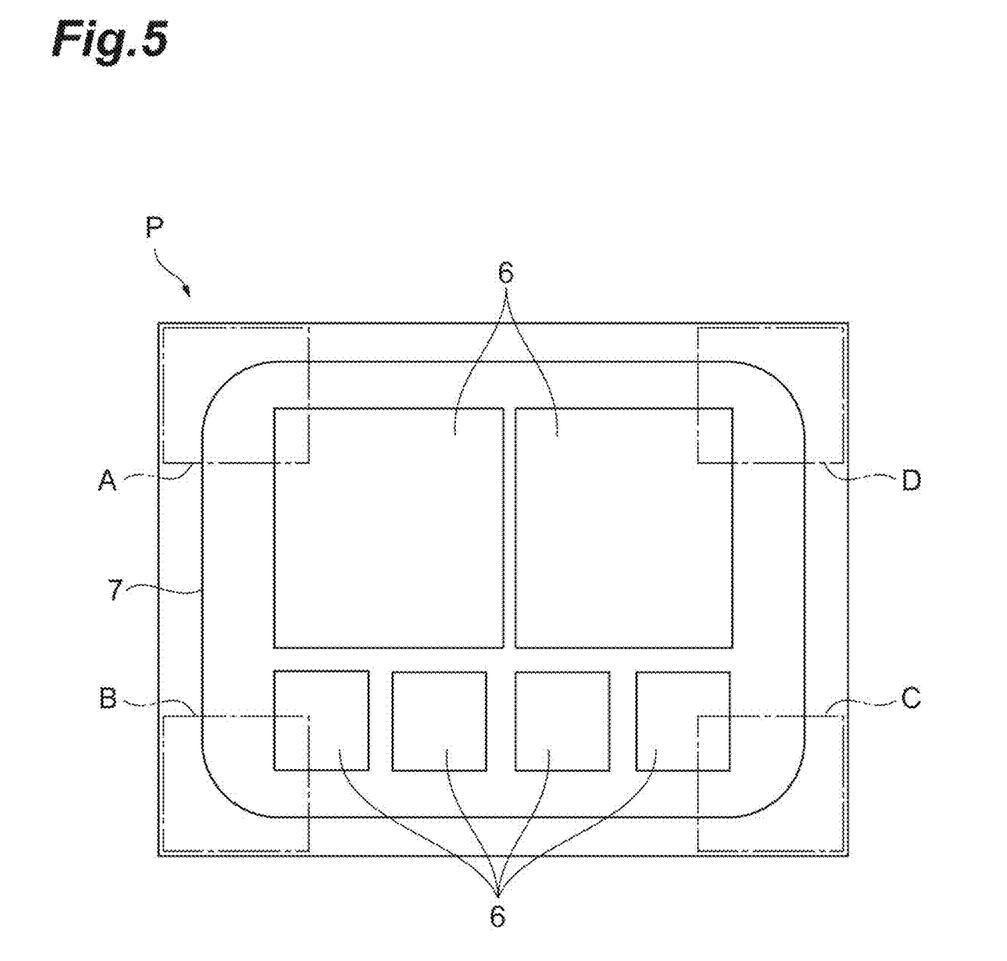
FIG. 5 is a plan view illustrating a detection position of the power semiconductor device.

In the present embodiment, as illustrated in FIG. 5, a plurality of detection positions including a peripheral portion of the power semiconductor device P is set on the other surface side of the power semiconductor device P (a side on which the emitter electrode 6 is formed). More specifically, four detection positions A to D corresponding to respective corners are set on one surface side of the power semiconductor device P. Each of detection positions A to D includes a curved portion of the guard ring 7 annularly formed to surround the emitter electrode 6. In addition, four point photodetectors 21A to 21D are disposed to correspond to the four detection positions A to D.

As illustrated in FIG. 4, distal ends of respective probes 22 of the four point photodetectors 21 are disposed just above the detection positions A to D by driving of the drive stage 11. The respective probes 22 receive emitted light resulting from the avalanche breakdown from the power semiconductor device P at the respective detection positions A to D, respectively, and guide the light to the point photodetectors 21A to 21D. The point photodetectors 21A to 21D detect the light guided from the probes 22 and output detection signals based on detection results to the analysis unit 16.

The imaging unit 14 and the illumination unit 15 are used to acquire an image for aligning the detection positions A to D of the power semiconductor device P and the probes 22 of the light detection unit 13. As the imaging unit 14, for example, it is possible to use a two-dimensional photodetector such as a CCD camera or a CMOS camera. Further, as the illumination unit 15, for example, it is possible to use fiber illumination using a halogen lamp, an LED, etc. For example, the imaging unit 14 monitors one surface side of the power semiconductor device P coaxially with an optical axis of the probe 22 through a pair of half mirrors 18 and 19. Since the power semiconductor device P is placed on the drive stage 11 in the black box 17, illumination light is used for monitoring by the imaging unit 14. For this reason, the illumination unit 15 illuminates the other surface side of the power semiconductor device P with illumination light coaxially with an observation axis of the imaging unit 14 through the pair of half mirrors 18 and 19.

The analysis unit 16 is physically configured by a computer including a memory such as a RAM or a ROM, a processor (arithmetic circuit) such as a CPU, a communication interface, a storage unit such as a hard disk, and a display unit such as a display. Examples of such an analysis unit 16 include a personal computer, a cloud server, a smart device (a smartphone, a tablet terminal, etc.), etc. The analysis unit 16 functions as a controller 31 that controls operations of the application unit 12, the drive stage 11, the imaging unit 14, and the illumination unit 15 by causing a CPU of a computer system to execute a program stored in the memory. In addition, the analysis unit 16 functions as a comparison unit 32 and a determination unit 33 by causing the CPU of the computer system to execute a program stored in the memory. The analysis unit 16 may be configured by a microcomputer, a field-programmable gate array (FPGA), etc.

The comparison unit 32 compares temporal changes of the detection signals acquired by the light detection unit 13. More specifically, the comparison unit 32 receives the detection signals from the point photodetectors 21A to 21D and the trigger signal output from the application unit 12, respectively. The comparison unit 32 causes time axes of the detection signals from the point photodetectors 21A to 21D to coincide with each other with reference to the timing of the trigger signal. Further, for each of the detection positions A to D, the comparison unit 32 calculates a time from a reception time of the trigger signal to a time when the intensity of the detection signal reaches a peak (hereinafter, referred to as a peak appearance time). The comparison unit 32 calculates an average value of peak appearance times at the respective detection positions A to D, and outputs information indicating a calculation result to the determination unit 33.

The determination unit 33 determines the quality of the power semiconductor device P based on a comparison result in the comparison unit 32. The determination unit 33 holds in advance, as a threshold value, a range in which the average value of the peak appearance times at the respective detection positions A to D can be obtained for a normal power semiconductor device. Upon reception of the information indicating the calculation result of the average value of the peak appearance times at the respective detection positions A to D from the comparison unit 32, the determination unit 33 compares the average value with the threshold value, and determines the quality of the power semiconductor device P based on a comparison result.

Figure 6:
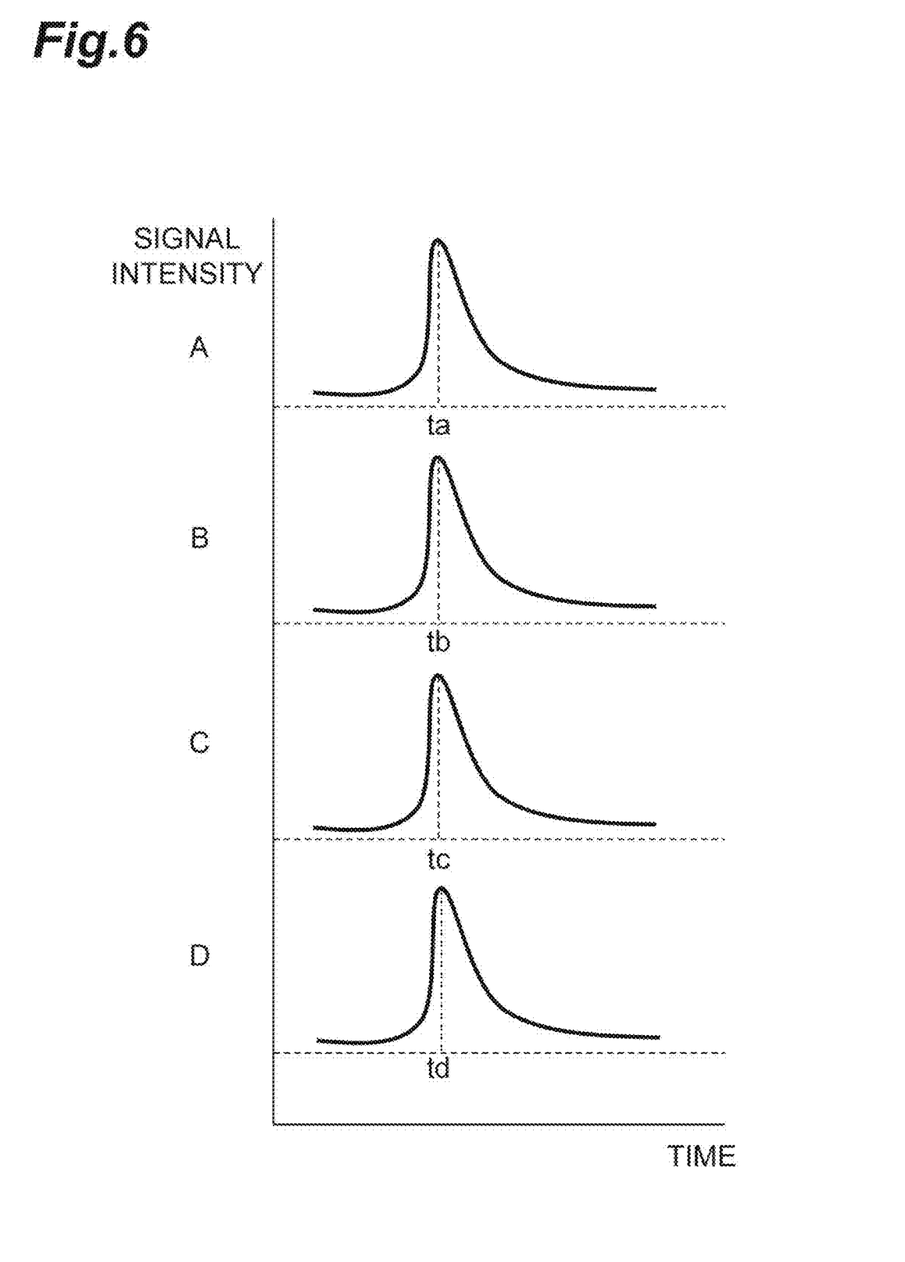
FIG. 6 is a diagram illustrating an example of each time waveform of a detection signal at each detection position of a normal power semiconductor device.

FIG. 6 is a diagram illustrating an example of each time waveform of a detection signal at each detection position of the normal power semiconductor device. An internal structure is uniform in the power semiconductor device P corresponding to an object to be analyzed (see FIG. 2). For this reason, in the normal power semiconductor device, the respective temporal changes of the detection signals at the respective detection positions A to D are uniform, and the peak appearance times ta to td of the respective detection signals substantially coincide with each other. Therefore, the average value of the peak appearance times of the detection positions A to D falls within a threshold range.

Figure 7:
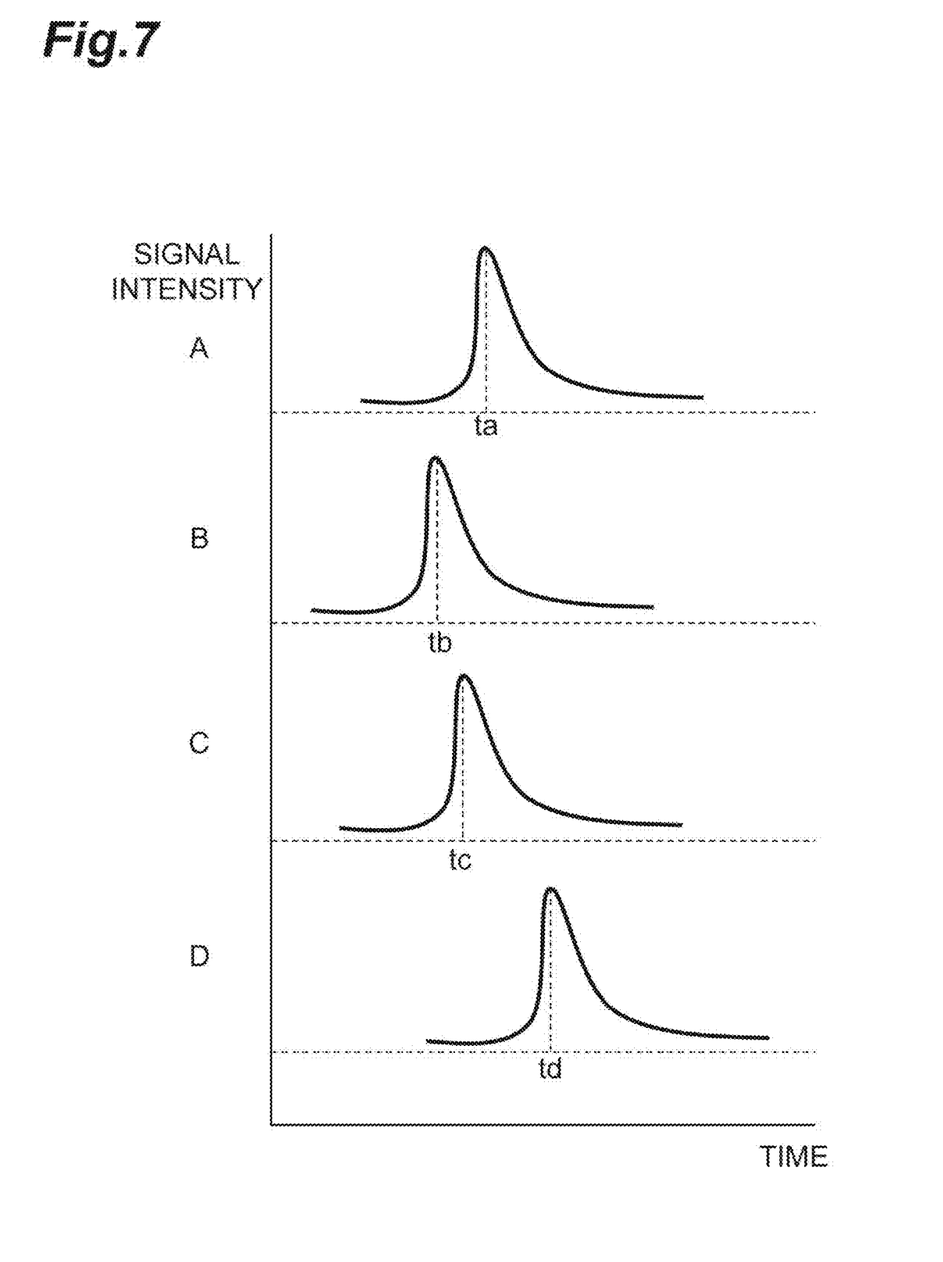
FIG. 7 is a diagram illustrating an example of each time waveform of a detection signal at each detection position of an abnormal power semiconductor device.

Meanwhile, FIG. 7 is a diagram illustrating an example of each time waveform of a detection signal at each detection position of an abnormal power semiconductor device. In an example of the figure, for comparison with the normal power semiconductor device, a part of the power semiconductor device is cut using a focused ion beam (FIB) to create an abnormal power semiconductor device, which is used as an object to be analyzed. In this abnormal power semiconductor device, variations occur in respective temporal changes of detection signals at the respective detection positions A to D, and the peak appearance times ta to td of the respective detection signals are in a wide range. Therefore, the average value of the peak appearance times at the detection positions A to D is out of the threshold range.

Figure 8:
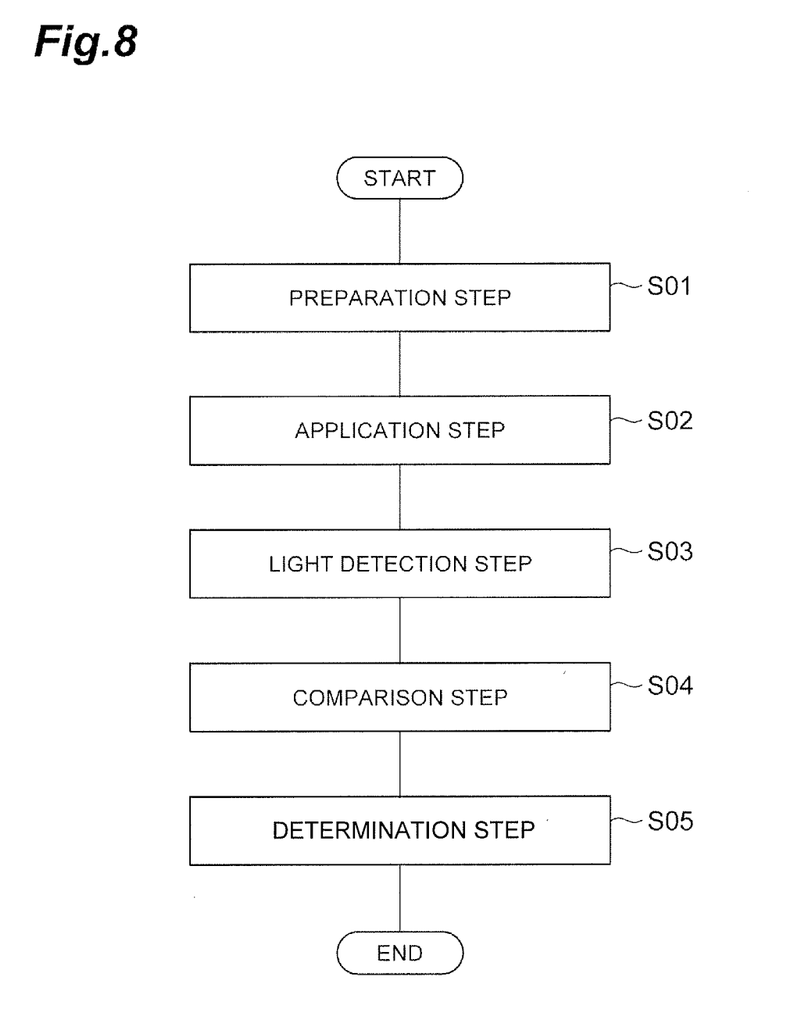
FIG. 8 is a flowchart illustrating an embodiment of a device analysis method.

Next, a description will be given of a device analysis method using the above-described device analysis apparatus 1. FIG. 8 is a flowchart illustrating an embodiment of the device analysis method.

As illustrated in the figure, the device analysis method includes a preparation step (step S01), an application step (step S02), a light detection step (step S03), a comparison step (step S04), and a determination step (step S05).

The preparation step is a step of setting the power semiconductor device P corresponding to an object to be analyzed in the device analysis apparatus 1. In the preparation step, the power semiconductor device P is placed on the drive stage 11 in the black box 17. Further, the drive stage 11 is driven in the in-plane direction of the mounting surface while irradiating the power semiconductor device P with illumination light by the illumination unit 15, and the detection positions A to D of the power semiconductor device P are aligned with respect to the distal ends of the probes 22 of the light detection unit 13.

The application step is a step of applying a voltage signal to the power semiconductor device P. In the application step, a voltage signal that causes avalanche breakdown is applied to the power semiconductor device P. In addition, a trigger signal indicating an application timing of the voltage signal to the power semiconductor device P is generated by the application unit 12 and output to the analysis unit 16.

The light detection step is a step of detecting light from the power semiconductor device P at a plurality of detection positions, and outputting detection signals based on detection results. In the light detection step, emitted light caused by the avalanche breakdown from the power semiconductor device P at the respective detection positions A to D is received by the probes 22 and guided to the point photodetectors 21A to 21D. In each of the point photodetectors 21A to 21D, light guided from the probe 22 is detected, and a detection signal based on a detection result is output to the analysis unit 16. In the light detection step, light emission occurring from the power semiconductor device P which is repeatedly operated may be detected by application of the voltage signal in the application step, and light emission occurring from the power semiconductor device P operated once may be detected.

The comparison step is a step of comparing the temporal changes of the detection signals with a preset threshold value. In the comparison step, based on the detection signals from the point photodetectors 21A to 21D and the trigger signal output from the application unit 12, each of the peak appearance times ta to td of the respective time waveforms of the detection signals at the respective detection positions A to D is calculated. In addition, in the comparison step, for example, the average value of the peak appearance times ta to td at the respective detection positions A to D is calculated as the temporal change of the detection signal.

The determination step is a step of determining the quality of the power semiconductor device P based on the temporal change of the detection signal. In the determination step, for example, the average value of the peak appearance times ta to td at the respective detection positions A to D is compared with a preset threshold value, and the quality of the power semiconductor device P is determined based on a comparison result. Here, when the average value of the peak appearance times ta to td is within the threshold range, it is determined that the power semiconductor device P is normal. When the average value of the peak appearance times ta to td is out of the threshold range, it is determined that the power semiconductor device P is abnormal.

As described above, the device analysis apparatus 1 applies a voltage signal to the power semiconductor device P. Then, light from the power semiconductor device P is detected at each of the plurality of detection positions A to D, and the quality of the power semiconductor device P is determined based on the temporal change of the detection signal. An internal structure is uniform in the power semiconductor device P corresponding to an object to be analyzed. For this reason, while the temporal changes of the detection signals at the plurality of detection positions A to D are uniform in the normal power semiconductor device, variations occur in the temporal changes of the plurality of detection signals in the abnormal power semiconductor device. Therefore, with reference to the temporal changes of the detection signals at the plurality of detection positions A to D, the quality of the power semiconductor device P can be accurately determined by operation analysis before breakdown of an element.

In addition, the device analysis apparatus 1 further includes the comparison unit 32 that compares the temporal changes of the detection signals with a preset threshold value, and the determination unit 33 determines the quality of the power semiconductor device P based on a comparison result in the comparison unit 32. In this way, it is possible to quantitatively compare the temporal changes of the plurality of detection signals. Therefore, it is possible to more accurately determine the quality of the power semiconductor device P.

In addition, in the device analysis apparatus 1, the light detection unit 13 detects light from the power semiconductor device P at the plurality of detection positions A to D including the peripheral portion of the power semiconductor device P. The peripheral portion (particularly, the corner) of the power semiconductor device P is a part in which the guard ring 7 corresponding to a ground potential is disposed and an electric field is easily concentrated. For this reason, by performing detection in the peripheral portion of the power semiconductor device P, it is possible to detect light having high intensity, and to easily detect light by application of a voltage signal.

In addition, in the device analysis apparatus 1, the light detection unit 13 includes the point photodetectors 21A to 21D having the probes 22, and light from the power semiconductor device P can be simultaneously detected at the plurality of detection positions A to D. In this way, light detection at the plurality of detection positions A to D can be rapidly performed.

In addition, in the device analysis apparatus 1, the application unit 12 applies a voltage signal causing avalanche breakdown to the power semiconductor device, and the light detection unit 13 detects light emission occurring in the power semiconductor device P due to the avalanche breakdown. By detection of the light emission due to the avalanche breakdown, a difference between the temporal changes of the detection signals due to the quality of the power semiconductor device P becomes remarkable, and the quality of the power semiconductor device P can be more accurately determined.

In addition, in the device analysis apparatus 1, the light detection unit 13 has a time resolution of 1 μs or less. In this way, it is possible to accurately comprehend the temporal changes of the detection signals. In particular, a case in which the time resolution of the light detection unit 13 is 100 ns to 1 μs and a wavelength range is 200 nm to 2,000 nm is suitable for detection of light emission resulting from avalanche breakdown.

The present disclosure is not limited to the embodiment. For example, even though the power semiconductor device P is moved by the drive stage 11 to align the detection positions A to D with the distal ends of the probes 22 of the point photodetector 21 in the embodiment, the point photodetector 21 may be moved by the drive stage 11 to align the detection positions A to D with the distal ends of the probes 22 of the point photodetector 21. In addition, since emitted light in the power semiconductor device P may leak to the outside through a metal surface, the detection position may be set on one surface side (collector electrode 3 side) of the power semiconductor device P.

When a two-dimensional photodetector is used as the light detection unit 13, the drive stage 11 may move the power semiconductor device P so that the entire chip of the power semiconductor device P is included in a detection field of view, and each temporal change may be obtained by designating the detection positions A to D from a detected image. The detection positions A to D may be individually designated by manual input of a user. Alternatively, the detection positions A to D may be automatically designated by the analysis unit 16 based on an image captured by the imaging unit 14. For example, four corners of the power semiconductor device P may be subjected to image recognition, and the analysis unit 16 may designate positions thereof as the detection positions.

Figure 3:
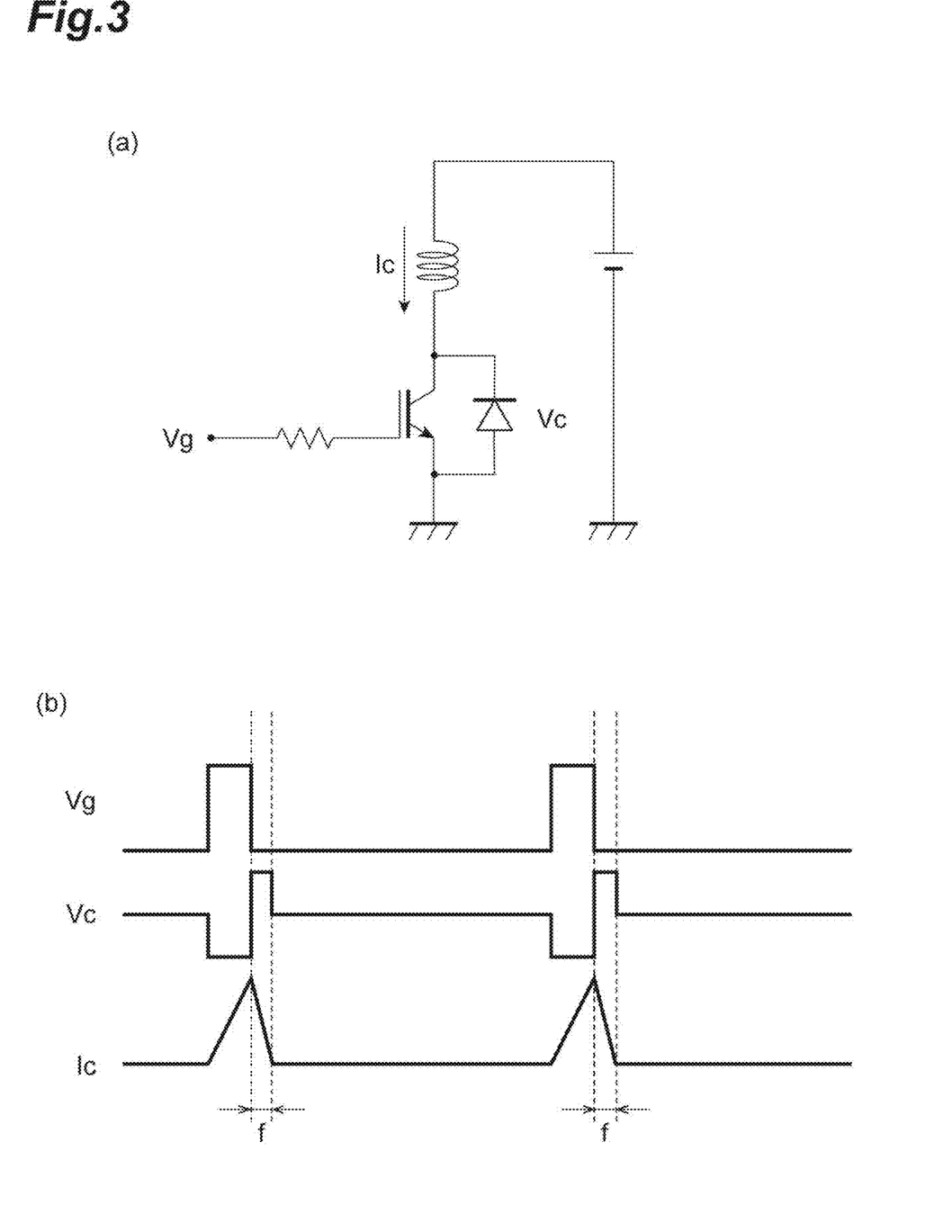
FIG. 3(a) is an equivalent circuit diagram of the power semiconductor device at the time of analysis execution.
FIG. 3(b) is a diagram illustrating a relationship between a voltage signal and a current waveform.

In addition, in the embodiment, the application unit 12 repeatedly applies a positive voltage signal modulated in a rectangular pulse shape to the power semiconductor device P. However, the voltage signal applied to the power semiconductor device P may correspond to one pulse. Further, in the embodiment, the time axes of the detection signals from the point photodetectors 21A to 21D are caused to coincide with each other based on the timing of the trigger signal output from the application unit 12. However, the trigger signal may not be used, and the time axes of the detection signals from the point photodetectors 21A to 21D may be caused to coincide with each other based on the fall timing of Vg (see FIG. 3(*b*)).

In addition, the light detection unit 13 may individually detect the light from the power semiconductor device P at the plurality of detection positions A to D. In this case, for example, the light detection unit 13 includes the point photodetector 21 having one probe 22, and the power semiconductor device P is moved by the drive stage 11 to perform application of a voltage signal and detection of light in order at the detection positions A to D. According to such a method, a configuration of the light detection unit 13 can be simplified. Further, the light detection unit 13 may include one point photodetector 21 and an optical scanner (a galvano mirror, an MEMS mirror, etc.), and the above-described detection procedure may be performed. In this case, light from an arbitrary detection position on the power semiconductor device P can be individually detected by the optical scanner.

In addition, in the embodiment, the comparison unit 32 compares the temporal changes of the detection signals with the preset threshold value. However, the comparison unit 32 may compare the temporal changes of the detection signals with each other. In this case, for example, the comparison unit 32 calculates a variance of the peak appearance times ta to td at the respective detection positions A to D, and the determination unit 33 determines the quality of the power semiconductor device P based on a value of the variance. In this case, for example, based on the preset threshold value, the determination unit 33 determines that the power semiconductor device P is normal when the variance is within a range less than or equal to, the threshold value, and determines that the power semiconductor device P is abnormal when the variance is a value larger than the threshold value. In this case, temporal changes of the plurality of detection signals are quantitatively compared. Therefore, it is possible to more accurately determine the quality of the power semiconductor device P.

Figure 9:
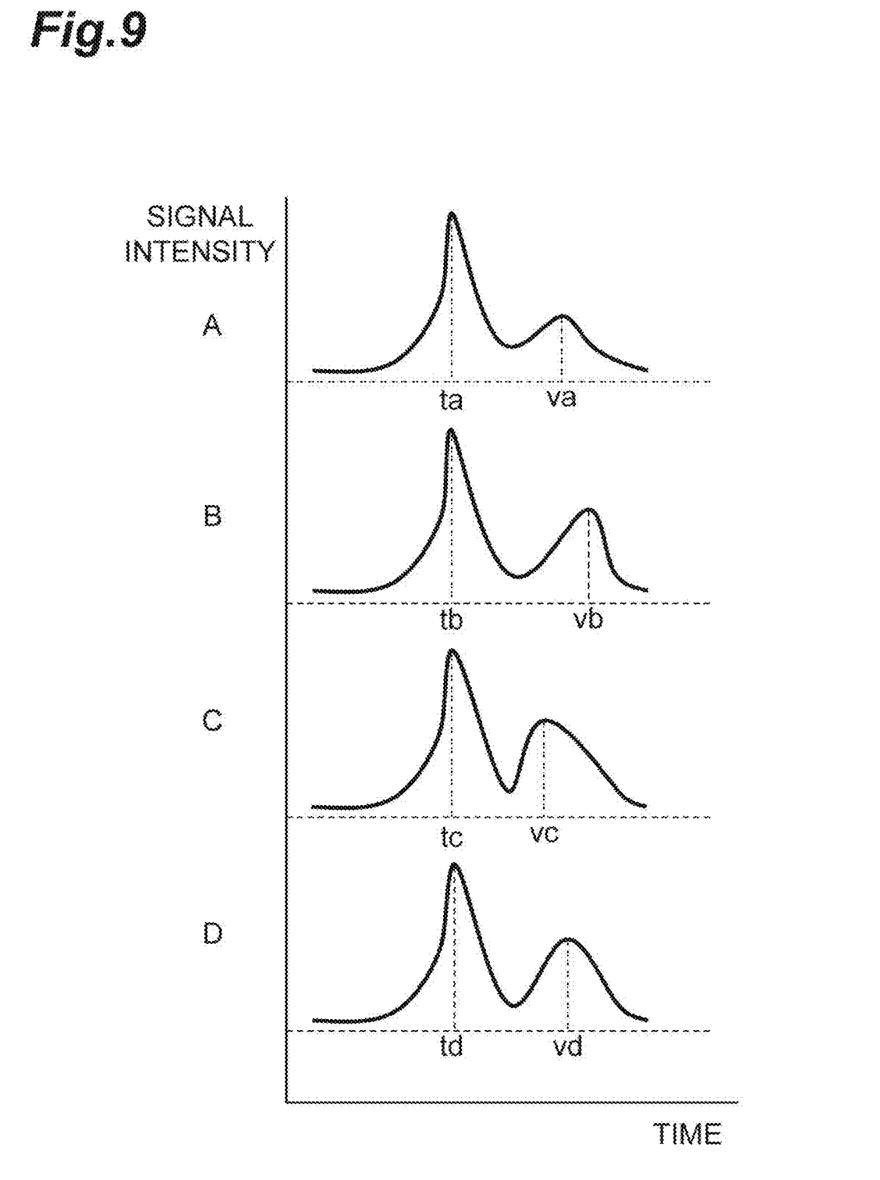
FIG. 9 is a diagram illustrating another example of a method of comparing detection signals by a comparison unit.

When a second peak appears in the time waveform of the detection signal as illustrated in FIG. 9, the quality of the power semiconductor device P may be determined based on a difference between a peak appearance time of a first peak and a peak appearance time of the second peak. In this case, at each of the detection positions A to D, the comparison unit 32 calculates each of the differences va–ta, vb–tb, vc–tc, and vd–td between peak appearance times of first peaks and peak appearance times of second peaks. The determination unit 33 can determine the quality of the power semiconductor device P using an average value or a variance of these values.

In addition, the drive stage 11 may be configured to move an optical system including the light detection unit 13, the imaging unit 14, the illumination unit 15, and the pair of half mirrors 18 and 19. In such a configuration, the power semiconductor device P can be relatively moved. Further, an LSM optical system may be configured by using a point photodetector such as a photodiode as the imaging unit 14, using an SLD or a laser light source as the illumination unit 15, and disposing an optical scanner (a galvano mirror, an MEMS mirror, etc.) on an optical path between the half mirror 18 and the power semiconductor device P. In such a configuration, it is possible to preferably acquire an image for aligning the detection positions A to D of the power semiconductor device P with the probes 22 of the light detection unit 13.

REFERENCE SIGNS LIST

1: device analysis apparatus, 12: application unit, 13: light detection unit, 32: comparison unit, 33: determination unit, A to D: detection position, P: power semiconductor device.

The invention claimed is:

1. An apparatus comprising:
an applicator configured to apply a pulse-like modulated voltage signal to a power semiconductor device;
a light detector configured to detect light emission from the power semiconductor device at a plurality of detection positions and output detection signals based on detection results, the light emission occurring in the power semiconductor device based on the applicator applying the pulse-like modulated voltage signal to the power semiconductor device, wherein the light emission resulting occurs in a curved portion surrounding the power semiconductor device, wherein a time resolution of the light detector is 1 μs or less, and wherein the light emission resulting from avalanche breakdown that first occurs at a highest intensity in the curved portion of a guard ring annularly provided to surround the power semiconductor device; and
a processor configured to determine a quality of the power semiconductor device based on temporal changes of the detection signals accompanying the application of the pulse-like modulated voltage signal.

2. The apparatus according to claim 1, wherein the processor is further configured to compare the temporal changes of the detection signals with a preset threshold value,
wherein the processor determines the quality of the power semiconductor device based on a comparison result.

3. The apparatus according to claim 1, wherein the processor is further configured to compare the temporal changes of the detection signals with each other,
wherein the processor determines the quality of the power semiconductor device based on a comparison result.

4. The apparatus according to claim 1, wherein the light detector detects light from the power semiconductor device at a plurality of detection positions including a peripheral portion of the power semiconductor device.

5. The apparatus according to claim 1, wherein the light detector simultaneously detects light from the power semiconductor device at the plurality of detection positions.

6. The apparatus according to claim 1, wherein the light detector individually detects light from the power semiconductor device at the plurality of detection positions.

7. The apparatus according to claim 1, wherein the applicator applies the pulse-like modulated voltage signal to the power semiconductor device causing the avalanche breakdown to the power semiconductor device.

8. The apparatus according to claim 7, wherein the light detector detects the light emission occurring in the power semiconductor device due to the avalanche breakdown.

9. The apparatus according to claim 1, wherein the time resolution of the light detector is 100 ns to 1 μs.

10. A method comprising:
applying a pulse-like modulated voltage signal to a power semiconductor device;
detecting light emission from the power semiconductor device at a plurality of detection positions and outputting detection signals based on detection results, the light emission occurring in the power semiconductor device based on the applying the pulse-like modulated voltage signal to the power semiconductor device, wherein the light emission resulting occurs in a curved portion surrounding the power semiconductor device, wherein the light is detected at a time resolution of 1 μs or less, and wherein the light emission resulting from avalanche breakdown that first occurs at a highest intensity in the curved portion of a guard ring annularly provided to surround the power semiconductor device; and determining the quality of the power semiconductor device based on temporal changes of the detection signals accompanying the application of the pulse-like modulated voltage signal.

11. The method according to claim 10, further comprising comparing the temporal changes of the detection signals with a preset threshold value,
wherein the quality of the power semiconductor device is determined based on a comparison result.

12. The method according to claim 10, further comprising comparing the temporal changes of the detection signals with each other,
wherein the quality of the power semiconductor device is determined based on a comparison result.

13. The method according to claim 10, wherein light from the power semiconductor device is detected at a plurality of detection positions including a peripheral portion of the power semiconductor device.

14. The method according to claim 10, wherein light from the power semiconductor device is simultaneously detected at the plurality of detection positions.

15. The method according to claim 10, wherein light from the power semiconductor device is individually detected at the plurality of detection positions.

16. The method according to claim 10, wherein the pulse-like modulated voltage signal applied to the power semiconductor device causing the avalanche breakdown to the power semiconductor device.

17. The method according to claim 16, wherein the light emission occurring in the power semiconductor device due to the avalanche breakdown is detected.

* * * * *